US011043959B1

(12) United States Patent
Melanson et al.

(10) Patent No.: US 11,043,959 B1
(45) Date of Patent: Jun. 22, 2021

(54) CURRENT DIGITAL-TO-ANALOG CONVERTER WITH WARMING OF DIGITAL-TO-ANALOG CONVERTER ELEMENTS

(71) Applicant: Cirrus Logic International Semiconductor Ltd., Edinburgh (GB)

(72) Inventors: John L. Melanson, Austin, TX (US); Johann G. Gaboriau, Austin, TX (US); Lei Zhu, Austin, TX (US); Wai-Shun Shum, Austin, TX (US); Xiaofan Fei, Austin, TX (US); Leyi Yin, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/942,062

(22) Filed: Jul. 29, 2020

Related U.S. Application Data

(60) Provisional application No. 62/944,974, filed on Dec. 6, 2019.

(51) Int. Cl.
*H03M 1/74* (2006.01)
*H04R 3/00* (2006.01)
*H03M 3/00* (2006.01)

(52) U.S. Cl.
CPC ............. *H03M 1/742* (2013.01); *H03M 3/30* (2013.01); *H04R 3/00* (2013.01)

(58) Field of Classification Search
CPC ............. H03M 1/742; H03M 3/30; H04R 3/00
USPC ..................................... 341/143–144
See application file for complete search history.

(56) References Cited

U.S. PATENT DOCUMENTS

| 7,903,010 B1 | 3/2011 | Melanson |
| 7,956,782 B2 * | 6/2011 | Werking .................. H03M 3/35 |
| | | 341/143 |
| 9,118,239 B2 | 8/2015 | Xu et al. |
| 9,853,658 B1 * | 12/2017 | Hsiao .................... H03M 3/506 |

* cited by examiner

*Primary Examiner* — Khai M Nguyen
(74) *Attorney, Agent, or Firm* — Jackson Walker L.L.P.

(57) ABSTRACT

A differential output current digital-to-analog (IDAC) circuit may include a delta-sigma modulator configured to receive a digital input signal, a control circuit responsive to the delta-sigma modulator configured to perform a DAC decode operation, a plurality of DAC elements responsive to the DAC decode operation, the plurality of DAC elements configured to, in concert, generate a differential output current signal based on the digital input signal to a load coupled to a pair of output terminals of the IDAC, and a plurality of warming switches, each warming switch coupled to a respective bias transistor of a respective DAC element of the plurality of DAC elements, wherein the control circuit may further be configured to selectively control each such warming switch in order to selectively de-bias and bias a respective bias transistor of such warming switch when a respective DAC element of the respective bias transistor is output-disabled from generating the differential output current signal.

26 Claims, 5 Drawing Sheets

CURRENT DIGITAL-TO-ANALOG CONVERTER WITH WARMING OF DIGITAL-TO-ANALOG CONVERTER ELEMENTS

RELATED APPLICATION

The present disclosure claims priority to U.S. Provisional Patent Application Ser. No. 62/944,974, filed Dec. 6, 2019, which is incorporated by reference herein in its entirety.

FIELD OF DISCLOSURE

The present disclosure relates in general to circuits for audio devices, including without limitation personal audio devices, such as wireless telephones and media players, and more specifically, to systems and methods relating to a current-mode output digital-to-analog converter with a high-impedance output.

BACKGROUND

Mobile devices, including wireless telephones, such as mobile/cellular telephones, cordless telephones, mp3 players, and other consumer audio devices, are in widespread use. Such mobile devices may include circuitry for driving a transducer, including without limitation, a headphone, a speaker, a linear resonant actuator or other vibrational actuator, and/or any other suitable transducer.

It may be desirable to drive an audio output transducer with source impedances as high or higher than the nominal impedance of the transducer. One example is that of a 30-ohm (nominal) transducer driven by a driver with a 30- to 300-ohm source impedance. Such arrangement has traditionally been accomplished by a low-impedance voltage source in combination with a series resistor. However, such approach lacks power efficiency—for each watt dissipated in the transducer load, 10 watts may be dissipated in the series resistor, severely limiting power efficiency of a system.

Another approach may be to use current-mode feedback to effectively boost the output impedance of the driver. While this approach may solve the efficiency problem described in the previous paragraph, the gain of the current feedback loop may lead to noise problems, and loop stability problems may arise when an output impedance is unknown.

Accordingly, circuit architectures that overcome these disadvantages are desired.

SUMMARY

In accordance with the teachings of the present disclosure, one or more disadvantages and problems associated with existing approaches to calibrating a digital-to-analog converter may be reduced or eliminated.

In accordance with embodiments of the present disclosure, a differential output current digital-to-analog (IDAC) circuit may include a delta-sigma modulator configured to receive a digital input signal, a control circuit responsive to the delta-sigma modulator configured to perform a DAC decode operation, a plurality of DAC elements responsive to the DAC decode operation, the plurality of DAC elements configured to, in concert, generate a differential output current signal based on the digital input signal to a load coupled to a pair of output terminals of the IDAC, and a plurality of warming switches, each warming switch coupled to a respective bias transistor of a respective DAC element of the plurality of DAC elements, wherein the control circuit may further be configured to selectively control each such warming switch in order to selectively de-bias and bias a respective bias transistor of such warming switch when a respective DAC element of the respective bias transistor is output-disabled from generating the differential output current signal.

In accordance with embodiments of the present disclosure, a method may be provided for use in a differential output current digital-to-analog (IDAC) circuit comprising a delta-sigma modulator configured to receive a digital input signal, a control circuit responsive to the delta-sigma modulator configured to perform a DAC decode operation, a plurality of DAC elements responsive to the DAC decode operation, the plurality of DAC elements configured to, in concert, generate a differential output current signal based on the digital input signal to a load coupled to a pair of output terminals of the IDAC, and a plurality of warming switches, each warming switch coupled to a respective bias transistor of a respective DAC element of the plurality of DAC elements. The method may include selectively controlling each such warming switch in order to selectively de-bias and bias a respective bias transistor of such warming switch when a respective DAC element of the respective bias transistor is output-disabled from generating the differential output current signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
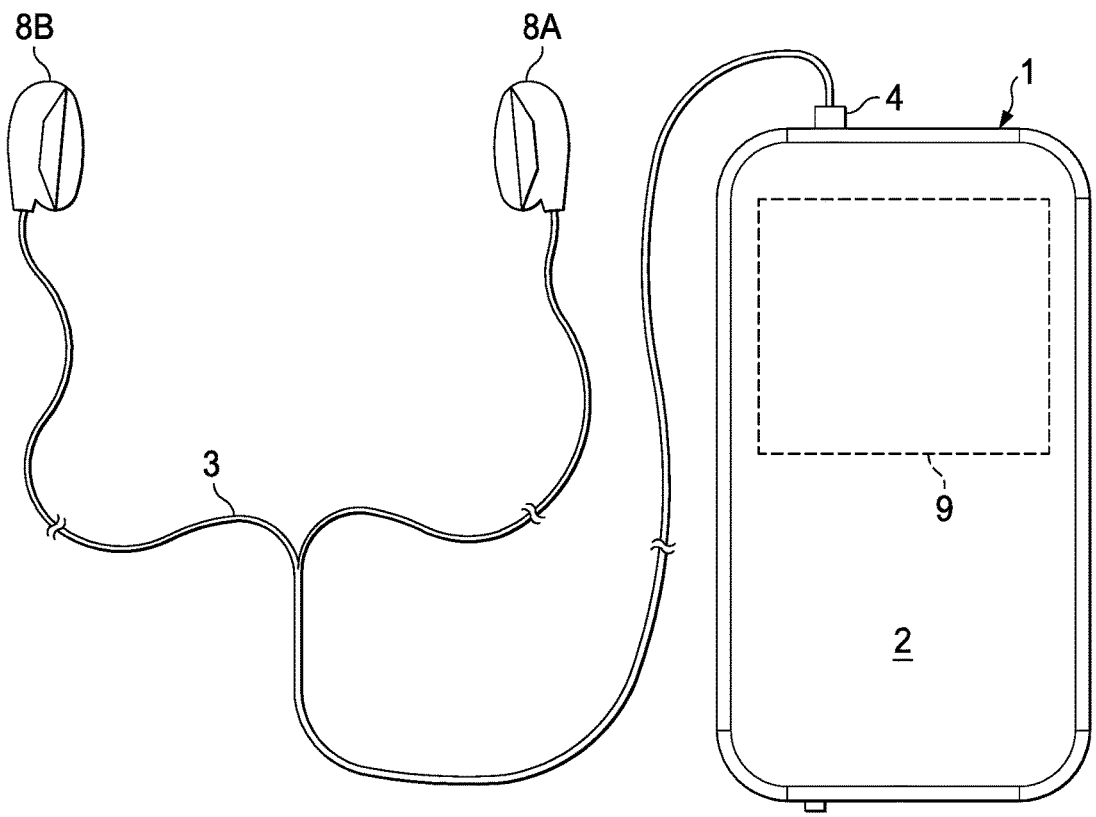
FIG. 1 is an illustration of an example personal audio device, in accordance with embodiments of the present disclosure.

FIG. 1 is an illustration of an example mobile device 1, in accordance with embodiments of the present disclosure. FIG. 1 depicts mobile device 1 coupled to a headset 3 in the form of a pair of earbud speakers 8A and 8B. Headset 3 depicted in FIG. 1 is merely an example, and it is understood that mobile device 1 may be used in connection with a variety of audio transducers, including without limitation, headphones, earbuds, in-ear earphones, and external speakers. A plug 4 may provide for connection of headset 3 to an electrical terminal of mobile device 1. Mobile device 1 may provide a display to a user and receive user input using a touch screen 2, or alternatively, a standard liquid crystal display (LCD) may be combined with various buttons, sliders, and/or dials disposed on the face and/or sides of mobile device 1. As also shown in FIG. 1, mobile device 1 may include an audio integrated circuit (IC) 9 for generating an analog audio signal for transmission to headset 3 and/or another audio transducer.

Figure 2:
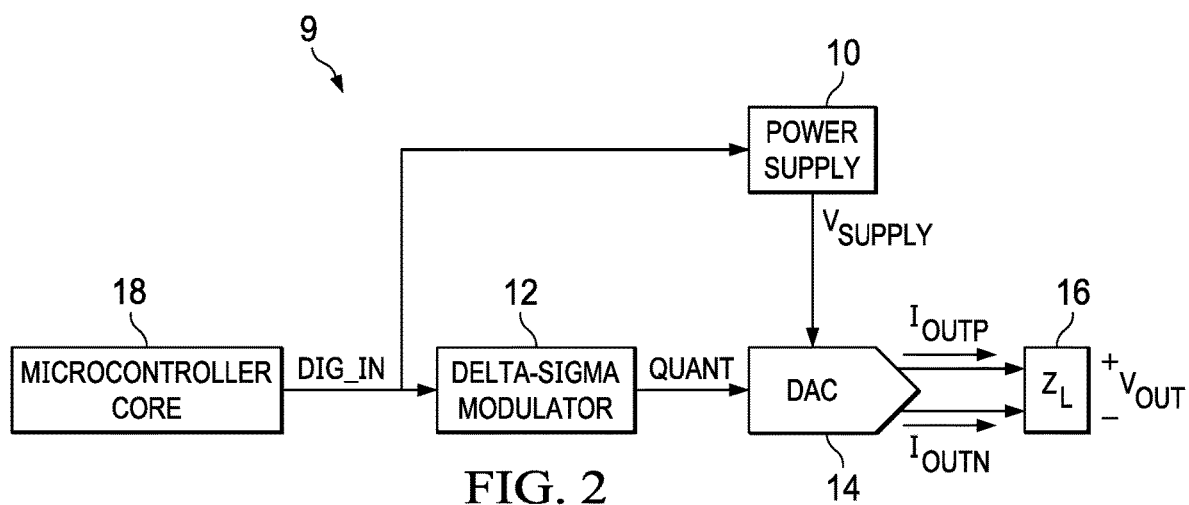
FIG. 2 is a block diagram of selected components of an example audio integrated circuit of a personal audio device, in accordance with embodiments of the present disclosure.

FIG. 2 is a block diagram of selected components of an example audio IC 9 of a mobile device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital delta-sigma modulator 12, which may convert it to a quantized (e.g., six-bit) signal QUANT at a sampling rate much higher than that of digital audio input signal DIG_IN (e.g., digital audio input signal DIG_IN may have a sampling rate of approximately 44 KHz and quantized signal QUANT may have a sampling rate of 1.6 MHz). Digital-to-analog converter (DAC) 14 may receive quantized signal QUANT which may convert quantized signal QUANT to a differential analog current-mode output signal equal to the difference between currents $I_{OUTP}$ and $I_{OUTN}$. DAC 14 may supply a differential analog current-mode input signal to an output transducer 16 having load impedance $Z_L$, such as one of earbud speakers 8A and 8B. A power supply 10 may provide the power supply rail inputs of DAC 14, and/or other components of audio IC 9. In some embodiments, power supply 10 may comprise a switched-mode power converter, as described in greater detail below.

Although FIGS. 1 and 2 depict an audio IC 9 for driving an audio transducer with a current-mode signal, it is understood that an IC similar or identical to audio IC 9 may be used to convert any suitable digital signal into a suitable output current signal for driving any suitable transducer, including non-audio transducers such as a linear resonant actuator or other suitable transducer. Further, the systems and methods described herein are not limited to mobile audio devices, and may also be used in video game controllers, touchscreens, automobiles, and any other device for which audio and/or haptic output is desirable.

Figure 3A:
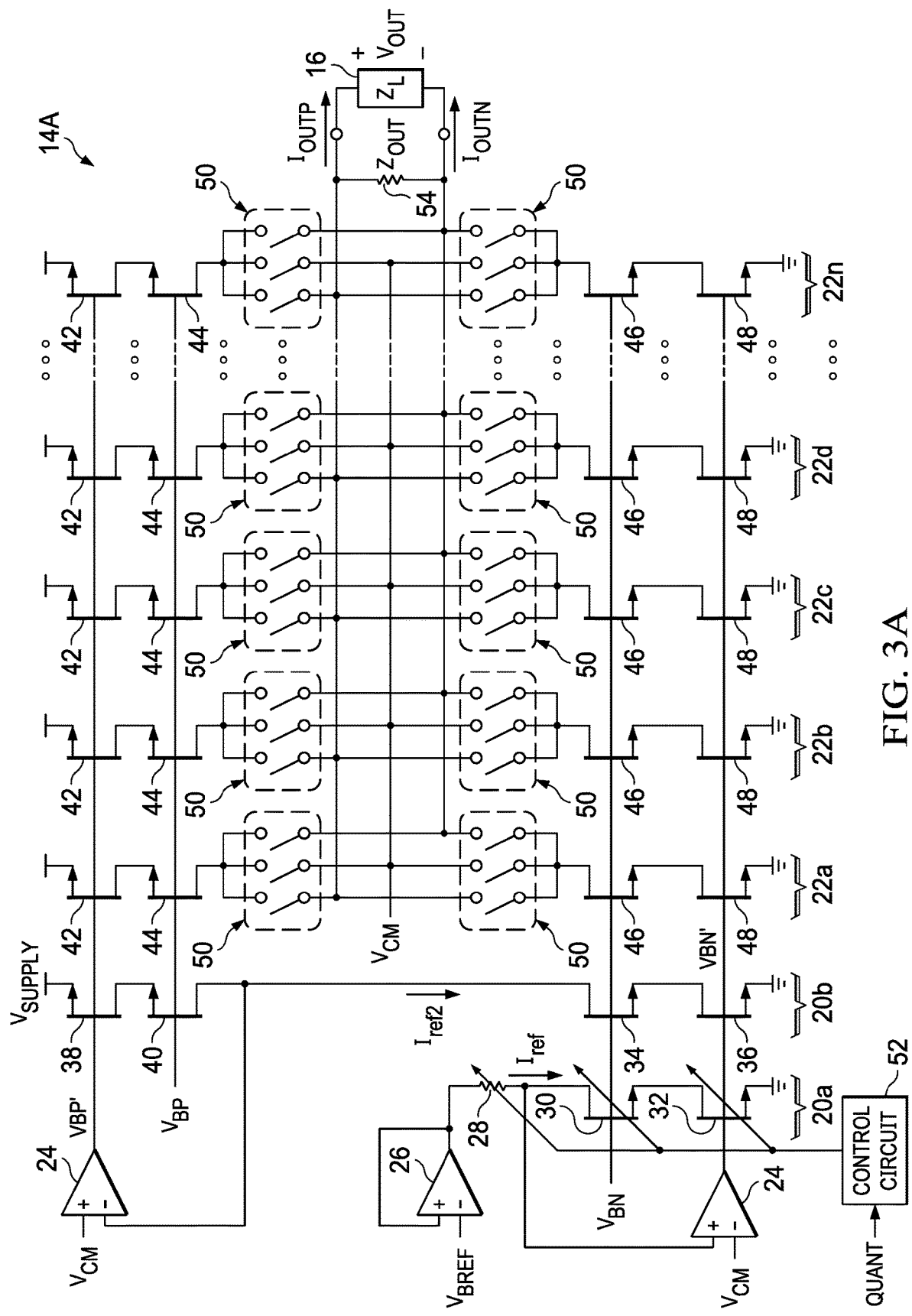
FIG. 3A is a circuit diagram of selected components of an example differential output current digital-to-analog converter (DAC) for use in the example audio integrated circuit of FIG. 2, in accordance with embodiments of the present disclosure.

FIG. 3A is a block diagram of selected components of an example differential output current DAC 14A which may be used to implement DAC 14 of example audio integrated circuit 9 of FIG. 2, in accordance with embodiments of the present disclosure. As shown in FIG. 3A, current DAC 14A may include one or more reference elements 20 (e.g., 20a, 20b), a plurality of current-mode DAC elements 22 (e.g., 22a, 22b, 22c, 22d, . . . , 22n), biasing operational amplifiers 24 and 26, a control circuit 52, and an output impedance 54 with impedance $Z_{OUT}$, coupled as depicted in FIG. 3A. When output transducer 16 is coupled to the output of current DAC 14A, output impedance 54 may be in parallel with impedance $Z_L$ of output transducer 16 as shown in FIG. 3A. Each DAC element 22 may comprise a differential current mirror comprising p-type field effect transistors 42 and 44, n-type field effect transistors 46 and 48, and a plurality of switches 50, coupled as shown in FIG. 3A. Reference element 20a may comprise n-type field effect transistors 30 and 32 and a reference resistor 28 coupled as shown in FIG. 3A. As shown in FIG. 3A, reference resistor 28 may have a variable resistance controlled by control circuit 52. In addition or alternatively, one or both of n-type field effect transistors 30 and 32 may have an admittance controlled by control circuit 52. To implement an n-type field effect transistor 30 and/or 32 as a variable-admittance transistor, each such transistor may comprise a plurality of switched transistors that are enabled and/or disabled under the control of control circuit 52 in order to achieve the desired admittance. Reference element 20b may comprise n-type field effect transistors 34 and 36 and p-type field effect transistors 38 and 40, coupled as shown in FIG. 3A.

In operation, a reference bias voltage $V_{BREF}$ may be applied as shown to operational amplifier 26 and a common mode voltage $V_{cm}$ may be applied as shown to operational amplifiers 24 to generate bias voltages for biasing n-type field effect transistors 32, 36, and 48 and p-type field effect transistors 38 and 42. In addition, a p-type bias voltage $V_{BP}$ may be applied to gates of p-type field effect transistors 38 and 40 to bias p-type field effect transistors 38 and 40, and an n-type bias voltage $V_{BN}$ may be applied to gates of n-type field effect transistors 30, 34, and 46 to bias n-type field effect transistors 30, 34, and 46. Accordingly, as so biased, a circuit is formed by which reference elements 20a and 20b generate reference currents $I_{ref}$ and $I_{ref2}$ as shown in FIG. 3, one of which (e.g., reference current $I_{ref2}$) may be used as a reference current for the differential current mirrors implemented by each current-mode DAC element 22. Thus, at least one reference element 20 may have a current mirror relationship with each of the plurality of current-mode DAC elements 22 such that each individual current through each current-mode DAC element 22 is a scaled version of a reference current (e.g., reference currents $I_{ref}$ and $I_{ref2}$) of the at least one reference element 20. For each current-mode DAC element 22, its respective switches 50 may be selectively enabled and disabled based on quantized signal QUANT. For purposes of clarity and exposition, the coupling of quantized signal QUANT and its individual bits to individual switches 50 is not shown. Accordingly, each current-mode DAC element 22 comprises a current source switched between one of the differential outputs (e.g., $I_{OUTP}$ or $I_{OUTN}$) or a common-mode ground (e.g., $V_{cm}$). Accordingly, output currents (e.g., $I_{OUTP}$ or $I_{OUTN}$) on each of the differential outputs may be the sum of current flowing into and out of the particular output from the individual current-mode DAC elements 22.

In some embodiments, each current-mode DAC element 22 may be sized or otherwise configured such that it generates a current which is a power of 2 greater than or less than another current-mode DAC element 22. For example, current-mode DAC element 22a may generate a current having twice the magnitude of the current generated by current-mode DAC element 22b, current-mode DAC element 22b may generate a current having twice the magnitude of the current generated by current-mode DAC element 22c, and so on. Therefore, in such embodiments, each current-mode DAC element 22 may correspond to a respective bit of quantized signal QUANT, and the respective switches 50 of a current-mode DAC element 22 may be selectively enabled and disabled based on the respective bit.

In other embodiments, each current-mode DAC element 22 may be sized or otherwise configured such that it generates a current which is approximately equal to all other current-mode DAC elements 22. Therefore, in such embodiments, control circuit 52 may decode quantized signal QUANT into a corresponding value, and the respective switches 50 of a current-mode DAC element 22 may be selectively enabled and disabled based on the corresponding value. For example, if quantized signal QUANT comprises six bits, current DAC 14A may comprise $2^6=64$ current-mode DAC elements 22, and respective switches 50 of current-mode DAC elements 22 may be enabled in accordance with the value corresponding to the digital code of quantized signal QUANT (e.g., for a six-bit code 000101, five current-mode DAC elements 22 may be enabled and 59 current-mode DAC elements 22 may be disabled).

Control circuit 52 may include any system, device, or apparatus configured to receive quantized signal QUANT (or another signal derived therefrom), and based on a characteristic (e.g., magnitude, frequency, etc.) of quantized signal QUANT, control one or more components of DAC 14A in order to scale current mirror ratios between at least one reference element 20 and the plurality of current-mode DAC elements 22. For example, control circuit 52 may modify current mirror ratios between at least one reference element 20 and the plurality of current-mode DAC elements 22 responsive to the magnitude of quantized signal QUANT crossing a predetermined threshold magnitude. As a specific example, in response to quantized signal QUANT crossing from above to below such predetermined threshold magnitude, control circuit 52 may control one or more components of DAC 14A to decrease a reference current (e.g., $I_{ref}$ and/or $I_{ref2}$) while increasing a scaling ratio of the currents of current-mode DAC elements 22 relative to a current of at least one reference element 20. In these and other embodiments, such predetermined threshold magnitude may be a threshold magnitude for entering or exiting a noise gating mode of the playback path of the audio signal, whereby noise gating involves, for low magnitudes of an audio input signal (e.g., quantized signal QUANT), an output signal (e.g., difference between $I_{OUTP}$ or $I_{OUTN}$) of an audio system forced to zero, so as to avoid audio output of noise present in the signal path.

In some embodiments, control circuit 52 may be configured to modify current mirror ratios between the at least one reference element 20 and the plurality of current-mode digital-to-analog elements 22 by modifying a resistance (e.g., resistance of variable resistor 28) of the at least one reference element 20 for setting a current of the at least one reference element 20. In these and other embodiments, control circuit 52 may be configured to modify current mirror ratios between the at least one reference element 20 and the plurality of current-mode digital-to-analog elements 22 by modifying an effective device size (e.g., admittance) of the at least one reference element 20 (e.g., the effective admittance of one or both of n-type field effect transistors 30 or 32) for setting a current of the at least one reference element 20. Although, for the purposes of descriptive clarity, FIG. 3A shows n-type field effect transistors 34 and 36 and p-type field effect transistors 38 and 40 as not having variable admittances controllable by control circuit 52, in some embodiments, control circuit 52 may be configured to modify current mirror ratios between the at least one reference element 20 and the plurality of current-mode digital-to-analog elements 22 by modifying an effective device size of one or more of n-type field effect transistors 34 and 36 and p-type field effect transistors 38 and 40 in addition to or in lieu of modifying an effective device size of n-type field effect transistors 30 and/or 32. Because control circuit 52 may perform such scaling of current mirror ratios by modifying components of a reference element 20: (a) such scaling of current mirror ratios may be performed such that an amount of current flowing through the plurality of current-mode digital-to-analog elements 22 is unchanged when the ratios are scaled and such that the current flowing through the reference element 20 is changed; and/or (b) the plurality of current-mode digital-to-analog elements 22 may be unchanged when the ratios are scaled.

In these and other embodiments, in order to reduce or eliminate audio artifacts associated with modifying current mirror ratios, control circuit 52 may modify current mirror ratios during one or more blanking windows of the audio playback path of audio IC 9, wherein each of the one or more blanking windows comprises a finite time duration within a sampling period of DAC 14A in which the output of DAC 14A is prevented from being transmitted to a downstream circuit (e.g., amplifier 16) coupled to the output.

Figure 3B:
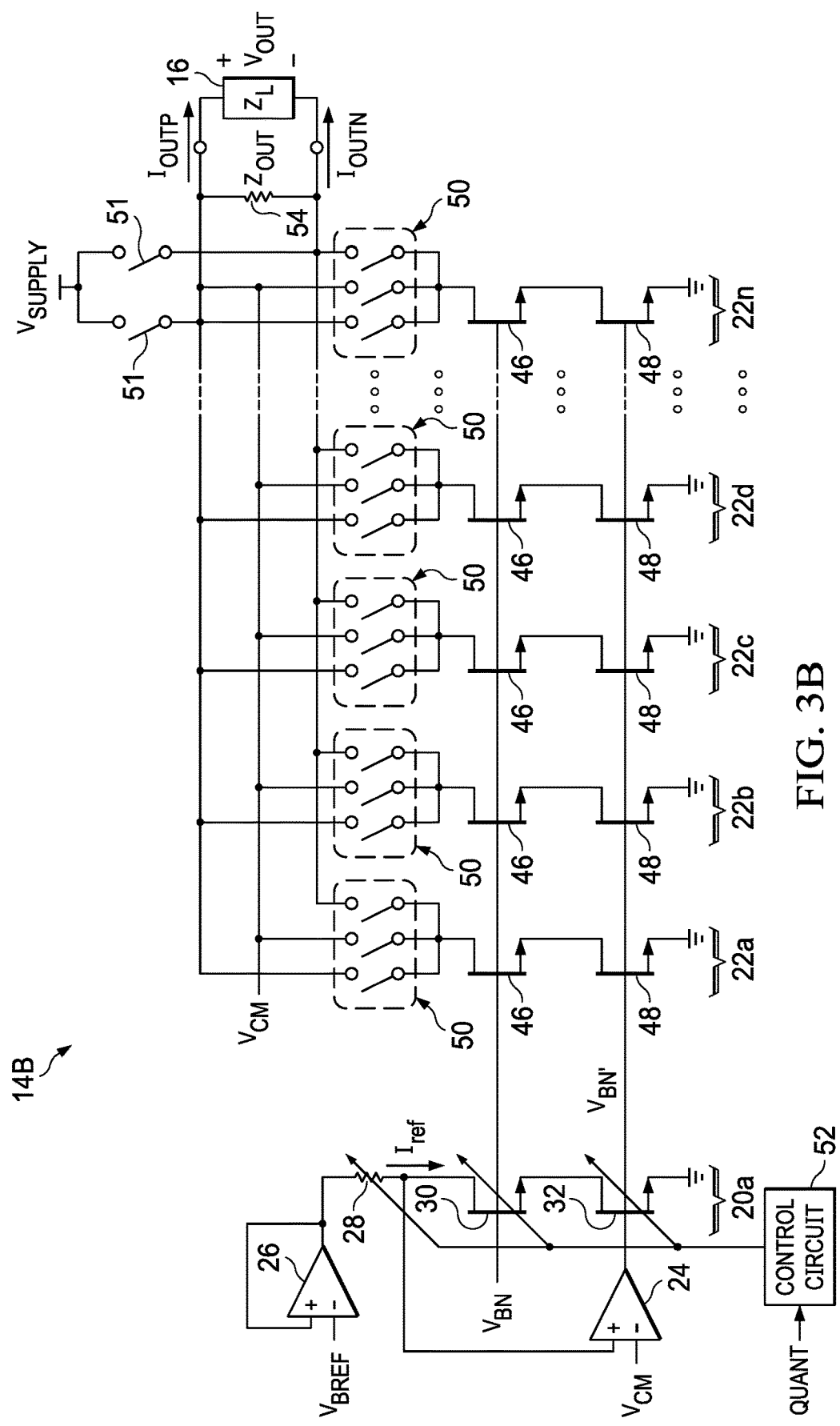
FIG. 3B is a circuit diagram of selected components of an example single-ended output current digital-to-analog converter (DAC) for use in the example audio integrated circuit of FIG. 2, in accordance with embodiments of the present disclosure.

FIG. 3B is a block diagram of selected components of an example single-ended output current DAC 14B which may be used to implement DAC 14 of example audio integrated circuit 9 of FIG. 2, in accordance with embodiments of the present disclosure. Current DAC 14B may be similar in many respects to current DAC 14A, and thus only selected differences between current DAC 14B and current DAC 14A may be discussed below. Notably, one main difference is that in current DAC 14B, the bottom half of each current-mode digital-to-analog element 22 may remain largely unchanged from FIG. 3A while the top halves of all current-mode digital-to-analog elements 22 may be replaced with a pair of polarity switches 51, such that one polarity switch 51 is enabled for positive output voltage $V_{OUT}$ and the other polarity switch 51 is enabled for negative output voltage $V_{OUT}$. Although not shown in the figures, in an alternative embodiment, the bottom half of current-mode digital-to-analog elements 22 may be replaced with a pair of polarity switches 51 while the top half of each current-mode digital-to-analog element 22 remains largely unchanged from FIG. 3A.

It is noted that FIGS. 3A and 3B represent example architectures for a current-mode DAC 14, and any other suitable architecture for a current-mode DAC may be used in accordance with this disclosure.

Using the architecture shown in FIGS. 2 and 3A and 3B, digital delta-sigma modulator 12 may receive digital audio input signal DIG_IN and convert it into quantized signal QUANT. Current-mode DAC 14 may convert quantized signal QUANT into a differential current signal represented by currents $I_{OUTP}$ or $I_{OUTN}$. If these current steps were applied directly to output transducer 16 (e.g., without presence of output impedance 54), resulting voltage spikes across output transducer 16 may limit an ability of DAC 14 to maintain accuracy and linearity. However, the presence of output impedance 54 in parallel with output transducer 16 (as opposed to in series, as may be the case with a voltage-mode output implementation) may limit such voltage spikes and maintain a reasonable voltage swing.

Any such voltage spike on output transducer 16 may be directly proportional to a step size of quantized signal QUANT generated by delta-sigma modulator 12. Accordingly, to further limit such voltage spike, delta-sigma modulator 12 may be configured to constrain the step size between successive output samples of quantized signal QUANT, for example as described in U.S. Pat. No. 7,903,010, which is incorporated by reference herein. For example, if a present quantized signal QUANT has a value of x, delta-sigma modulator 12 may limit the next output sample of quantized signal QUANT to the set {x−1, x, x+1} or {x−2, x−1, x, x+1, x+2}. Thus, assuming output impedance $Z_{OUT}$ of 300Ω (even though output impedance $Z_{OUT}$ may be of any impedance level), if the least-significant bit of DAC 14 generates a current of 100 μA, a voltage step may be equal to 100 μA×300Ω=30 mV in the case of quantized signal QUANT having a sample-to-sample constraint of changing by one quantization level, and equal to 200 μA×300Ω=60 mV in the case of quantized signal QUANT having a sample-to-sample constraint of changing by two quantization levels, which may be a small enough voltage spike in some applications to provide desired precision and accuracy.

As can be seen in FIGS. 3A and 3B, whenever a current-mode digital-to-analog element 22 is active, respective switches 50 of such digital-to-analog element 22 may be selectively enabled and disabled such that a path is created through one of such switches to one of the current-mode outputs of DAC 14A and DAC 14B. On the other hand, whenever a current-mode digital-to-analog element 22 is active, respective switches 50 of such digital-to-analog element 22 may be selectively enabled and disabled such that a path is created through one of such switches to common-mode voltage $V_{CM}$. Thus, for a six-bit, 64-element DAC, each set of switches 50 may include a pair of output-enabling switches and one "dump" switch for closing a path to common-mode voltage $V_{CM}$, meaning such a DAC would have 64 pairs of output-enabling switches and 64 dump switches. As an example, for a value of quantized signal QUANT equal to 5 in current DAC 14B, five switches of digital-to-analog elements 22 may be enabled to create a path to the output terminal for current $I_{OUT}$ and 59 switches of digital-to-analog elements 22 may be enabled to create a path to common-mode voltage $V_{CM}$. While such an arrangement provides a high level of linearity for an output voltage across output impedance 54 and output transducer 16, DACs 14A and 14B may have a low power efficiency for low-level signals, as each digital-to-analog element 22 is active at all times, including paths between source voltage rails and common-mode voltage $V_{CM}$ when a digital-to-analog element 22 is disabled, meaning a digital-to-analog element 22 consumes power, even when disabled. One solution would be to disable bias p-type field effect transistors 42 and 48 of a digital-to-analog element 22 when such digital-to-analog element 22 is disabled, thus de-biasing such digital-to-analog element 22 and eliminating its current consumption. However, disabling the biasing of a digital-to-analog element 22 may lead to inter-symbol interference when a digital-to-analog element 22 is enabled, as such digital-to-analog element 22 may have a settling time in which such digital-to-analog element 22 "warms up" and settles into a starting bias. One way to disable bias p-type field effect transistors 42 and 48 is to simply leave such transistors 42 and 48 on, as such transistors will cease conducting current when their gate-to-drain voltages drop below their respective threshold voltages.

Figure 4:
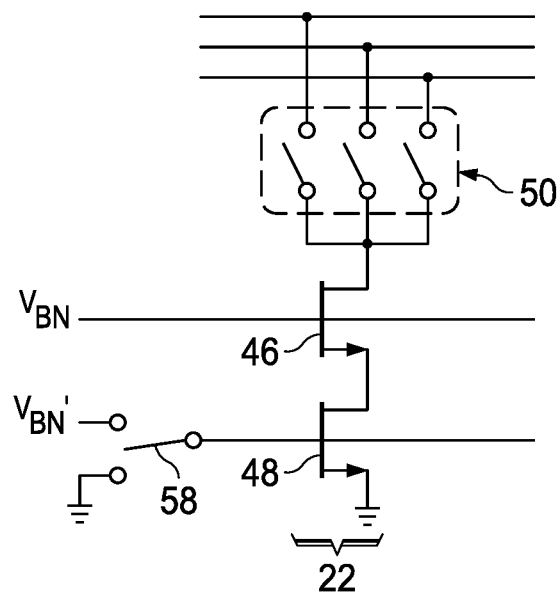
FIG. 4 is a circuit diagram of selected components of an example current DAC element, in accordance with embodiments of the present disclosure.

To overcome this disadvantage, in some embodiments, a digital-to-analog element 22 may be modified from that shown in FIG. 3B to that shown in FIG. 4 (a similar modification may be made to both halves of digital-to-analog elements 22 in the differential output case of FIG. 3A). As shown in FIG. 4, instead of a bias p-type field effect transistor 48 being biased with a bias voltage $V_{BN}$', control circuit 52 may control a switch 58 (e.g., a single-throw, double-pole switch) that selectively couples a gate of bias p-type field effect transistor 48 between bias voltage $V_{BN}$' (thus enabling bias p-type field effect transistor 48) and the ground voltage of the voltage source for the digital-to-analog element 22 (thus disabling bias p-type field effect transistor 48). Likewise, in the differential output architecture shown in FIG. 3A, instead of a bias p-type field effect transistor 42 being biased with a bias voltage $V_{BP}$', control circuit 52 may control a switch similar to switch 58 (e.g., a single-throw, double-pole switch) that selectively couples a gate of bias p-type field effect transistor 42 between bias voltage $V_{BP}$' (thus enabling bias p-type field effect transistor 42) and the rail voltage of the voltage source for the digital-to-analog element 22 (thus disabling bias p-type field effect transistor 42). Accordingly, using such architecture, control circuit 52 may selectively enable and disable bias p-type field effect transistors 42 and 48 of digital-to-analog elements 22, such that some disabled digital-to-analog elements 22 are de-biased and consume no current and such that one or more disabled digital-to-analog elements 22 are biased and thus remain "warmed" with switches 50 enabling a path to common-mode voltage $V_{CM}$, so that such "warmed" digital-to-analog elements 22 may be already biased when output-enabled, thus potentially minimizing inter-symbol interference. In other words, using such architecture, at least one disabled digital-to-analog element 22 may always be ready for use.

Although for the purposes of clarity and exposition, FIG. 4 illustrates a single digital-to-analog element 22 comprising an additional switch 58, each digital-to-analog element 22 of a current DAC 14 may include such additional switch 58 for biasing and de-biasing bias p-type field effect transistor 48 (and bias p-type field effect transistor 42 in the differential output architecture of FIG. 3A). Furthermore, in some embodiments, a switch 58 may be a single-throw, triple-pole switch that selectively switches among a ground voltage, a bias voltage ($V_{BP}$' or $V_{BN}$'), and a third voltage, wherein such third voltage is applied to a bias p-type field effect transistor 42 or a bias p-type field effect transistor 48 in order to warm a digital-to-analog element 22 associated with such switch 58.

Figure 5A:
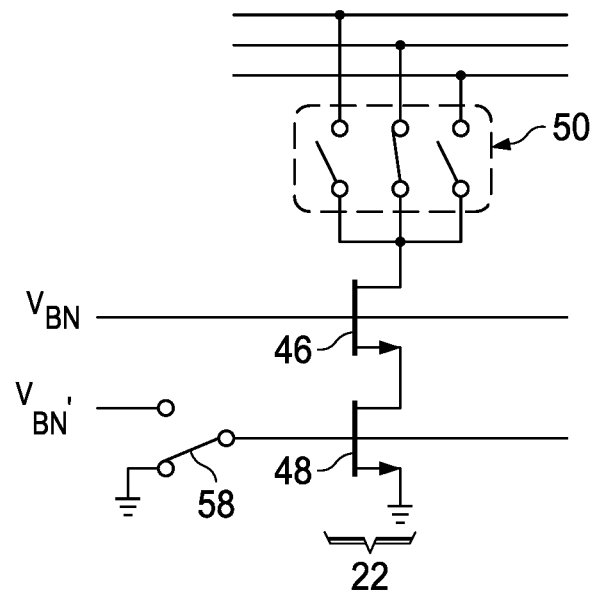
FIGS. 5A-5C is a circuit diagram of selected components of an example current DAC element in three different operational states, in accordance with embodiments of the present disclosure.
Figure 5B:
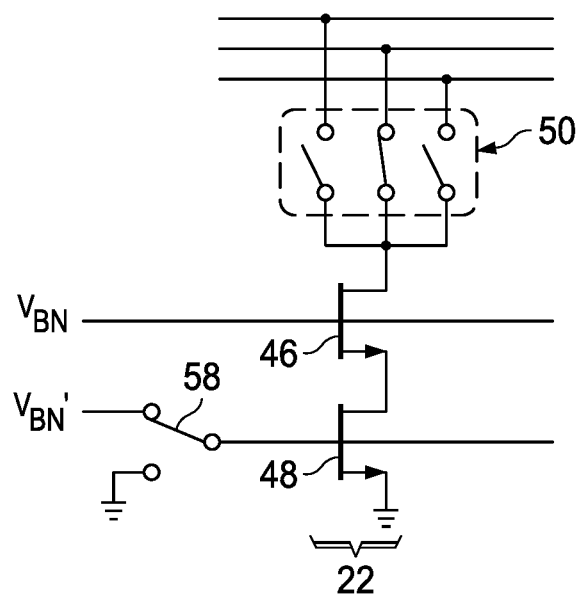
Figure 5C:
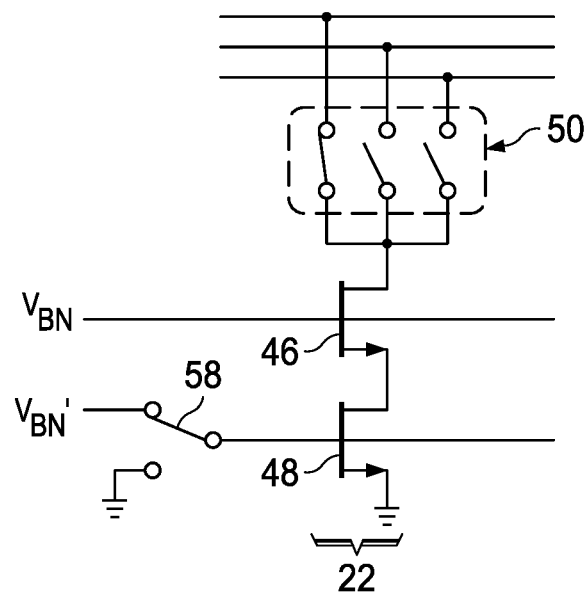

To further illustrate, FIG. 5A depicts a digital-to-analog element 22 of single-ended out DAC 14B in the de-biased, disabled state with switch 58 coupling the gate of bias n-type field effect transistor 46 to ground. In addition, FIG. 5B depicts a digital-to-analog element 22 of single-ended out DAC 14B in the biased, disabled (or "warm") state with switch 58 coupling the gate of bias n-type field effect transistor 46 to bias voltage $V_{BN}$' and with switches 50 arranged to create a path to common-mode voltage $V_{CM}$. Further, FIG. 5C depicts a digital-to-analog element 22 of single-ended out DAC 14B in the enabled state with switch 58 coupling the gate of bias n-type field effect transistor 46 to bias voltage $V_{BN}$' and with switches 50 arranged to create a path to one of the output nodes of DAC 14. Similar control may be applied to the top half of each digital-to-analog element 22 in the differential output DAC 14A, including bias n-type field effect transistor 42.

In operation, control circuit 52 may control the transistor 48 (and transistor 42 in the differential output architecture) and switches 50 and 58 in accordance with quantized signal QUANT, including maintaining at all times one or more digital-to-analog elements 22 in the biased, disabled state such that these one or more digital-to-analog elements 22 may be effectively switched to the enabled state if needed. Thus, as the magnitude of quantized signal QUANT increases, control circuit 52 may transition one or more digital-to-analog elements 22 from the biased, disabled state to the enabled state and transition one or more digital-toanalog elements 22 from the de-biased, disabled state to the biased, disabled state, in some embodiments such that the number of digital-to-analog elements 22 in the biased, disabled state remains constant. Likewise, as the magnitude of quantized signal QUANT decreases, control circuit 52 may transition one or more digital-to-analog elements 22 from the biased, disabled state to the de-biased, disabled state and transition one or more digital-to-analog elements 22 from the enabled state to the biased, disabled state, in some embodiments such that the number of digital-to-analog elements 22 in the biased, disabled state remains constant.

The number of digital-to-analog elements 22 maintained in the de-biased, disabled state may be determined by one or more suitable factors. For example, the number of digital-to-analog elements 22 maintained in the de-biased, disabled state may be based on a settling time of digital-to-analog elements 22, expected or allowable sample-to-sample changes in quantized signal QUANT, slew rate of digital audio input signal DIG_IN, signal frequency of digital audio input signal DIG_IN, magnitude of digital audio input signal DIG_IN, noise present in digital audio input signal DIG_IN, and/or other factors. In some instances, control circuit 52 may have predictive capabilities to estimate its need for digital-to-analog elements 22 and transition a suitable number of digital-to-analog elements 22 to the biased, disabled state based on such needs (e.g., based on slew rate of digital audio input signal DIG_IN, frequency of digital audio input signal DIG_IN, magnitude of digital audio input signal DIG_IN, noise present in digital audio input signal DIG_IN, effectiveness of other noise-cancelling effects, characteristics of playback material represented by digital audio input signal DIG_IN, and/or other factors).

In these and other embodiments, delta-sigma modulator 12 may be configured to constrain the values of output samples of quantized signal QUANT based on a number of digital-to-analog elements 22 maintained in the biased, disabled state. For example, delta-sigma modulator 12 may be configured to generate values for output samples of quantized signal QUANT such that, in any given sample cycle, the value of quantized signal QUANT does not cause a digital-to-analog element 22 maintained in the de-biased, disabled state to be transitioned to the enabled state within such sample cycle.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A differential output current digital-to-analog (IDAC) circuit comprising:
   a delta-sigma modulator configured to receive a digital input signal;
   a control circuit responsive to the delta-sigma modulator configured to perform a DAC decode operation;
   a plurality of DAC elements responsive to the DAC decode operation, the plurality of DAC elements configured to, in concert, generate a differential output current signal based on the digital input signal to a load coupled to a pair of output terminals of the IDAC; and
   a plurality of warming switches, each warming switch coupled to a respective bias transistor of a respective DAC element of the plurality of DAC elements, wherein the control circuit may further be configured to selectively control each such warming switch in order to selectively de-bias and bias a respective bias transistor of such warming switch when a respective DAC element of the respective bias transistor is output-disabled from generating the differential output current signal.

2. The IDAC of claim 1, wherein the control circuit is further configured to control the plurality of DAC elements and the plurality of warming switches in order to maintain one or more DAC elements in a biased, output-disabled state.

3. The IDAC of claim 2, wherein the control circuit is further configured to, responsive to an increase in a magnitude of the digital input signal:
transition one or more DAC elements from the biased, output-disabled state to the output-enabled state; and
transition one or more DAC elements from a de-biased, output-disabled state to the biased, output-disabled state.

4. The IDAC of claim 3, wherein the control circuit is further configured to maintain constant the number of DAC elements in the biased, output-disabled state in response to the decrease in the magnitude of the digital input signal.

5. The IDAC of claim 2, wherein the control circuit is further configured to, responsive to a decrease in a magnitude of the digital input signal:
transition one or more DAC elements from the biased, output-disabled state to the de-biased, output-disabled state; and
transition one or more DAC elements from the output-enabled state to the biased, output-disabled state.

6. The IDAC of claim 3, wherein the control circuit is further configured to maintain constant the number of DAC elements in the biased, output-disabled state in response to the decrease in the magnitude of the digital input signal.

7. The IDAC of claim 2, wherein the control circuit is further configured to maintain a number of DAC elements in the biased, output-disabled state based on a settling time of the plurality of DAC elements.

8. The IDAC of claim 2, wherein the control circuit is further configured to maintain a number of DAC elements in the biased, output-disabled state based on an expected or allowable sample-to-sample change in a quantized signal generated by the delta-sigma modulator.

9. The IDAC of claim 2, wherein the control circuit is further configured to maintain a number of DAC elements in the biased, output-disabled state based on a slew rate of the digital input signal.

10. The IDAC of claim 2, wherein the control circuit is further configured to maintain a number of DAC elements in the biased, output-disabled state based on a frequency of the digital input signal.

11. The IDAC of claim 2, wherein the control circuit is further configured to maintain a number of DAC elements in the biased, output-disabled state based on a magnitude of the digital input signal.

12. The IDAC of claim 2, wherein the control circuit is further configured to maintain a number of DAC elements in the biased, output-disabled state based on noise present in the digital input signal.

13. The IDAC of claim 2, wherein the delta-sigma modulator is further configured to constrain values of output samples of a quantized signal generated by the delta-sigma modulator based on a number of DAC elements maintained in the biased, output-disabled state.

14. A method in a differential output current digital-to-analog (IDAC) circuit comprising a delta-sigma modulator configured to receive a digital input signal, a control circuit responsive to the delta-sigma modulator configured to perform a DAC decode operation, a plurality of DAC elements responsive to the DAC decode operation, the plurality of DAC elements configured to, in concert, generate a differential output current signal based on the digital input signal to a load coupled to a pair of output terminals of the IDAC, and a plurality of warming switches, each warming switch coupled to a respective bias transistor of a respective DAC element of the plurality of DAC elements, the method comprising:
selectively controlling each such warming switch in order to selectively de-bias and bias a respective bias transistor of such warming switch when a respective DAC element of the respective bias transistor is output-disabled from generating the differential output current signal.

15. The method of claim 14, further comprising controlling the plurality of DAC elements and the plurality of warming switches in order to maintain one or more DAC elements in a biased, output-disabled state.

16. The method of claim 15, further comprising, responsive to an increase in a magnitude of the digital input signal:
transitioning one or more DAC elements from the biased, output-disabled state to the output-enabled state; and
transitioning one or more DAC elements from a de-biased, output-disabled state to the biased, output-disabled state.

17. The method of claim 16, further comprising maintaining constant the number of DAC elements in the biased, output-disabled state in response to the decrease in the magnitude of the digital input signal.

18. The method of claim 15, further comprising, responsive to a decrease in a magnitude of the digital input signal:
transitioning one or more DAC elements from the biased, output-disabled state to the de-biased, output-disabled state; and
transitioning one or more DAC elements from the output-enabled state to the biased, output-disabled state.

19. The method of claim 16, further comprising maintaining constant the number of DAC elements in the biased, output-disabled state in response to the decrease in the magnitude of the digital input signal.

20. The method of claim 15, further comprising maintaining a number of DAC elements in the biased, output-disabled state based on a settling time of the plurality of DAC elements.

21. The method of claim 15, further comprising maintaining a number of DAC elements in the biased, output-disabled state based on an expected or allowable sample-to-sample change in a quantized signal generated by the delta-sigma modulator.

22. The method of claim 15, further comprising maintaining a number of DAC elements in the biased, output-disabled state based on a slew rate of the digital input signal.

23. The method of claim 15, further comprising maintaining a number of DAC elements in the biased, output-disabled state based on a frequency of the digital input signal.

24. The method of claim 15, further comprising maintaining a number of DAC elements in the biased, output-disabled state based on a magnitude of the digital input signal.

25. The method of claim 15, further comprising maintaining a number of DAC elements in the biased, output-disabled state based on noise present in the digital input signal.

26. The method of claim 15, wherein the delta-sigma modulator is further configured to constrain values of output samples of a quantized signal generated by the delta-sigma modulator based on a number of DAC elements maintained in the biased, output-disabled state.

* * * * *

UNITED STATES PATENT AND TRADEMARK OFFICE
CERTIFICATE OF CORRECTION

PATENT NO. : 11,043,959 B1
APPLICATION NO. : 16/942062
DATED : June 22, 2021
INVENTOR(S) : Melanson et al.

It is certified that error appears in the above-identified patent and that said Letters Patent is hereby corrected as shown below:

In the Specification

1. In Column 6, Line 20, delete "amplifier 16)" and insert -- transducer 16) --, therefor.

Signed and Sealed this
Fifteenth Day of November, 2022

Katherine Kelly Vidal
*Director of the United States Patent and Trademark Office*